(12) United States Patent
Borlaug

(10) Patent No.: US 11,399,427 B2
(45) Date of Patent: Jul. 26, 2022

(54) HMN UNIT CELL CLASS

(71) Applicant: Lockheed Martin Corporation, Bethesda, MD (US)

(72) Inventor: David Byron Borlaug, Palmdale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 35 days.

(21) Appl. No.: 16/591,757

(22) Filed: Oct. 3, 2019

(65) Prior Publication Data
US 2021/0105892 A1    Apr. 8, 2021

(51) Int. Cl.
| H05K 1/02 | (2006.01) |
|---|---|
| H05K 3/40 | (2006.01) |
| H05K 3/06 | (2006.01) |
| H05K 3/46 | (2006.01) |
| H05K 1/11 | (2006.01) |
| H05K 1/16 | (2006.01) |

(52) U.S. Cl.
CPC .......... *H05K 1/0218* (2013.01); *H05K 1/115* (2013.01); *H05K 1/162* (2013.01); *H05K 3/06* (2013.01); *H05K 3/4038* (2013.01); *H05K 3/4644* (2013.01); *H05K 2201/093* (2013.01); *H05K 2201/09254* (2013.01); *H05K 2201/09281* (2013.01)

(58) Field of Classification Search
CPC .... H05K 3/4038; H05K 1/115; H05K 3/4644; H05K 1/0218; H05K 1/16; H05K 1/162; H05K 3/06; H05K 2201/093; H05K 2201/09281; H05K 2201/09254; H01Q 15/0026
See application file for complete search history.

(56) References Cited

U.S. PATENT DOCUMENTS 5,311,202 A * 5/1994 Popp .................. H01Q 15/0026
343/909
6,670,932 B1 * 12/2003 Diaz .................... H01Q 15/008
343/909
(Continued)

FOREIGN PATENT DOCUMENTS

CN    106025454 A    10/2016
CN    206098621 U    4/2017
(Continued)

*Primary Examiner* — Graham P Smith
*Assistant Examiner* — Jae K Kim
(74) *Attorney, Agent, or Firm* — Baker Botts L.L.P.

(57) ABSTRACT

In one embodiment, a system includes a ground layer, a first layer, a second layer, and a plurality of vias. The first layer includes a first insulating material and a plurality of first metallic strips. The second layer includes a second insulating material and a plurality of second metallic strips. The plurality of vias electrically connect one or more of the plurality of first metallic strips of the first layer to one or more of the plurality of second metallic strips of the second layer. The plurality of first metallic strips of the first layer and the plurality of second metallic strips of the second layer form a plurality of capacitors and a plurality of conductors. Each capacitor is located in the first layer. Each conductor is partially located in the first layer and partially located in the second layer.

12 Claims, 9 Drawing Sheets

(56) References Cited

U.S. PATENT DOCUMENTS

| | | | |
|---|---|---|---|
| 7,276,990 B2* | 10/2007 | Sievenpiper | H01P 5/04 |
| | | | 333/101 |
| 7,298,228 B2* | 11/2007 | Sievenpiper | H01P 1/127 |
| | | | 333/101 |
| 7,489,283 B2 | 2/2009 | Ingram et al. | |
| 7,626,216 B2* | 12/2009 | McKinzie, III | H01P 1/20 |
| | | | 257/532 |
| 7,719,477 B1* | 5/2010 | Sievenpiper | H01P 1/182 |
| | | | 343/754 |
| 8,436,785 B1* | 5/2013 | Lai | H01Q 15/002 |
| | | | 343/745 |
| 8,564,484 B2 | 10/2013 | Jan et al. | |
| 8,872,713 B1 | 10/2014 | Buckley et al. | |
| 8,890,767 B2 | 11/2014 | Choi et al. | |
| 9,385,436 B2 | 7/2016 | Milroy et al. | |
| 9,466,887 B2* | 10/2016 | Gregoire | H01Q 3/46 |
| 9,520,655 B2 | 12/2016 | Cerreno | |
| 9,780,434 B1* | 10/2017 | Weller | H01Q 9/065 |
| 10,069,213 B2 | 9/2018 | Song et al. | |
| 10,193,232 B2* | 1/2019 | Yang | H01Q 3/46 |
| 11,177,548 B1* | 11/2021 | Hiller | H01P 5/19 |
| 2002/0167456 A1* | 11/2002 | McKinzie, III | H01Q 3/46 |
| | | | 343/756 |
| 2003/0052757 A1* | 3/2003 | McKinzie, III | H01Q 15/008 |
| | | | 335/6 |
| 2003/0071763 A1* | 4/2003 | McKinzie, III | H01Q 15/0013 |
| | | | 343/754 |
| 2003/0231142 A1* | 12/2003 | McKinzie, III | H01Q 15/008 |
| | | | 343/909 |
| 2004/0201526 A1* | 10/2004 | Knowles | H01Q 3/24 |
| | | | 343/700 MS |
| 2005/0134521 A1* | 6/2005 | Waltho | H01Q 1/28 |
| | | | 343/909 |
| 2010/0271692 A1* | 10/2010 | Hor | G02B 1/007 |
| | | | 977/773 |
| 2013/0249755 A1 | 9/2013 | Sanchez et al. | |
| 2016/0294058 A1* | 10/2016 | Tunnell | H04W 4/80 |
| 2017/0075038 A1* | 3/2017 | Boulais | G02B 6/0043 |
| 2017/0179596 A1 | 6/2017 | Diaz et al. | |
| 2018/0053994 A1* | 2/2018 | Grando | H01Q 1/281 |
| 2018/0331414 A1* | 11/2018 | Tunnell | H01Q 7/08 |
| 2021/0370110 A1* | 12/2021 | Pankok, Jr. | G05D 1/106 |

FOREIGN PATENT DOCUMENTS

| | | |
|---|---|---|
| CN | 113314850 A * | 8/2021 |
| KR | 101284757 B1 | 7/2013 |

* cited by examiner

HMN UNIT CELL CLASS

TECHNICAL FIELD

This disclosure generally relates to a unit cell class, and more specifically to an HMN unit cell class.

BACKGROUND

A frequency selective surface is an engineered material that is constructed using traditional materials (e.g., copper Teflon, etc.) via micro-manufacturing methods. By placing these materials in intelligent micro-structures, the frequency selective surface may manifest material properties (e.g., frequency banded invisibility) beyond that of the component materials. Frequency selective surfaces are made up of tessellated unit cells. However, existing unit cells such as the H-cross unit cell have limited frequency filtering capabilities.

SUMMARY

According to an embodiment, a system includes a ground layer, a first layer, a second layer, and a plurality of vias. The first layer, which is stacked on the ground layer, includes a first insulating material and a plurality of first metallic strips. The second layer, which is stacked on the first layer, includes a second insulating material and a plurality of second metallic strips. The plurality of vias electrically connect one or more of the plurality of first metallic strips of the first layer to one or more of the plurality of second metallic strips of the second layer. The plurality of first metallic strips of the first layer and the plurality of second metallic strips of the second layer form a plurality of capacitors and a plurality of conductors. Each capacitor of the plurality of capacitors is located in the first layer. Each conductor of the plurality of conductors is partially located in the first layer and partially located in the second layer.

According to another embodiment, a unit cell includes a first layer, a second layer, and a plurality of vias. The first layer includes a first insulating material and a plurality of first metallic strips. The second layer includes a second insulating material and a plurality of second metallic strips. The plurality of vias electrically connect one or more of the plurality of first metallic strips of the first layer to one or more of the plurality of second metallic strips of the second layer.

According to yet another embodiment, a method includes forming a first layer of a unit cell and forming a plurality of first metallic strips on the first layer of the unit cell. The first layer of the unit cell includes a first insulating material. The method also includes forming a second layer of the unit cell and forming a plurality of second metallic strips on the second layer of the unit cell. The second layer of the unit cell includes a second insulating material. The method further includes forming a plurality of vias to electrically connect one or more of the plurality of first metallic strips of the first layer to one or more of the plurality of second metallic strips of the second layer.

Certain embodiments of this disclosure include a frequency selective surface unit cell class, and more specifically a new class of unit cell named herein as the HMN unit cell class. The canonical example of the HMN unit cell class is the H42 unit cell instance, where M=4 and N=2. The HMN unit cell class describes all unit cell instances that belong to the HMN unit cell class, where {M, N}={1 to infinity}. Example embodiments of the HMN unit cell class described herein include an H42 unit cell and an H84 unit cell.

Technical advantages of this disclosure may include one or more of the following. In certain embodiments, the H42 unit cell described herein includes four crossing "H" shapes that are electrically isolated from each other to avoid polarization coupling and voltage pinning. A first layer of the H42 unit cell is utilized for capacitive coupling and radiative coupling and a second layer the H42 unit cell is utilized for routing to alleviate unwanted cross-coupling between the four "H" shapes. Each "H" shape includes capacitors that do not overlap any other capacitors, which reduces capacitive vertical coupling. All capacitors of the H42 unit cell are the same distance from the ground layer, which reduces unwanted frequency detuning. The H42 unit cell reduces shadowing of illumination. In certain embodiments, the H42 unit cell provides simultaneous broad frequency coverage, dual polarization coverage, and multiple angle-of-incidence coverage. Some embodiments of the H42 unit cell may be well suited to readily available low-cost, light-weight, thin-board manufacturing.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

To assist in understanding the present disclosure, reference is now made to the following description taken in conjunction with the accompanying drawings, in which.

DETAILED DESCRIPTION

Embodiments of this disclosure describe an HMN unit cell class. The HMN unit cell class describes all unit cells that belong to the HMN unit cell class, where {M, N}={1 to infinity}. Example embodiments of the HMN unit cell class described herein include an H42 unit cell and an H84 unit cell. The HMN unit cell class describes a class of frequency selective surfaces, including the H42 unit cell and H84 unit cell.

The specific and abstract features of the HMN unit cell class are described herein through the description of unit cells that belong to the HMN class, which include the H42 unit cell and H84 unit cell. The specific features of the canonical H42 unit cell describe the basic features of the HMN unit cell class. Through the abstract extension of the H42 unit cell to the H84 unit cell via the abstract HMN unit cell class, the scope of all cells which all members of the HMN unit cell class are described.

While unit cells such as the H-cross unit cell are beneficial in filtering certain frequency bands, they do not cover broad frequency bands simultaneously (e.g., 900 MHz and 2.4 MHz frequencies). Existing unit cells also do not simultaneously cover dual polarizations and multiple angles-of-incidence. Certain classes of metamaterial unit cells have exhibited unfavorable coupling, which deleteriously shifts the frequency response of constituent structures. As an example, in the pursuit of broadband frequency coupling, certain embodiments of the dual-layer Jerusalem-cross (J-cross) unit cell exhibit undesired coupled frequency shifting. The HMN unit cell class overcomes these challenges by providing simultaneous broad frequency coverage, dual polarization coverage, and multiple angle-of-incidence coverage.

The HMN unit cell class applies to all unit cells that belong to the HMN unit cell class, where {M, N}={1 to infinity}. Example embodiments of the HMN unit cell class described herein include an H42 unit cell and an H84 unit cell. The H42 unit cell includes four crossing "H" shapes and the H84 unit cell includes eight crossing "H" shapes that are electrically isolated from each other to avoid polarization coupling and voltage pinning. A first layer of the HMN unit cell is utilized for capacitive coupling and radiative coupling and a second layer the HMN unit cell is utilized for routing to alleviate coupling between the "H" shapes. Polarization decoupling is achieved by eliminating the conductor crossing between vertical and horizontal structures. Reduction of unwanted frequency coupling is achieved by eliminating capacitor overlap coupling, maintaining a uniform separation between capacitors and the ground layer, and reducing shadowing effects.

Figure 1:
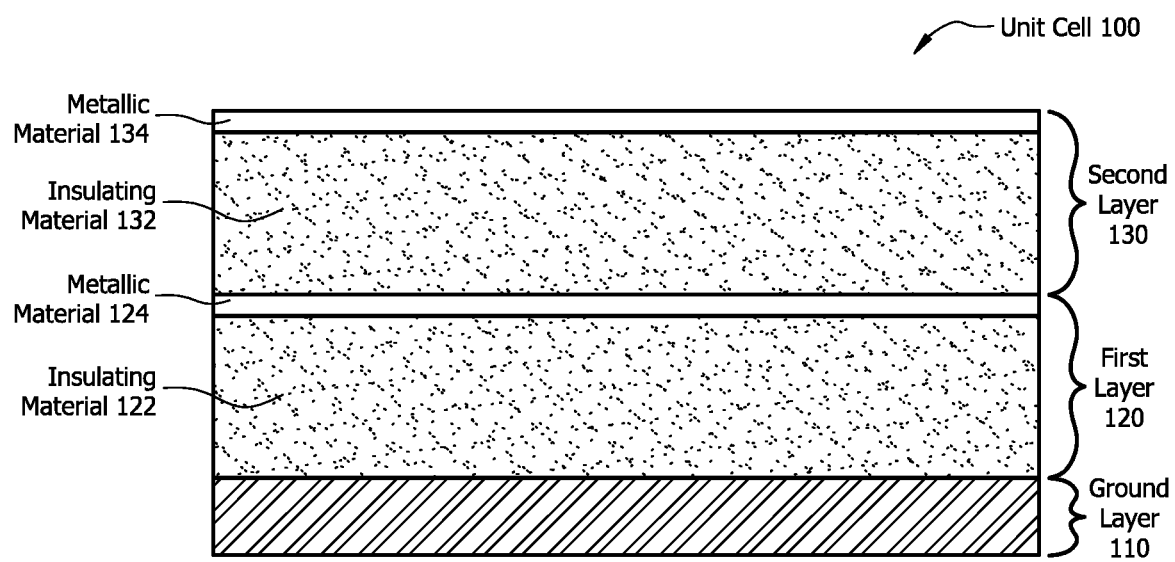
FIG. 1 illustrates a unit cell, in accordance with certain embodiments.
Figure 4A:
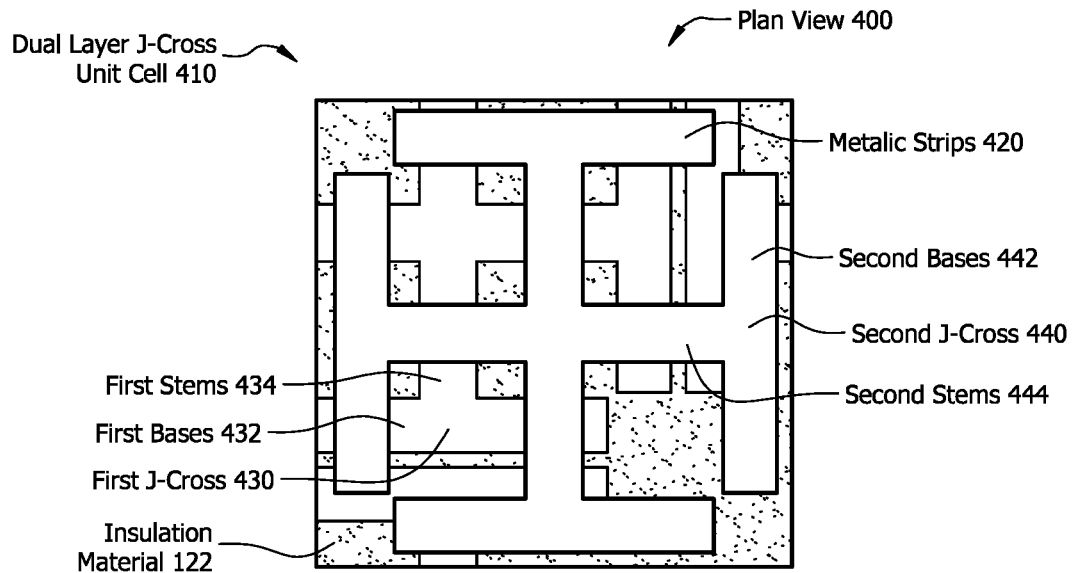
FIG. 4A illustrates a plan view of a dual layer J-cross unit cell, in accordance with certain embodiments.
Figure 4B:
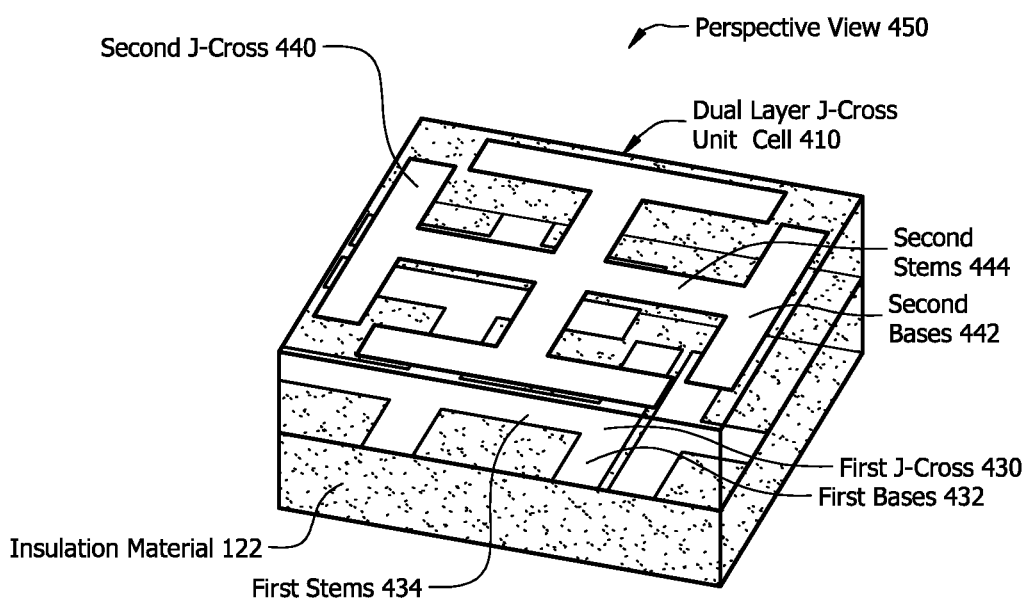
FIG. 4B illustrates a perspective view of the dual layer J-cross unit cell of FIG. 4A, in accordance with certain embodiments.
Figure 5A:
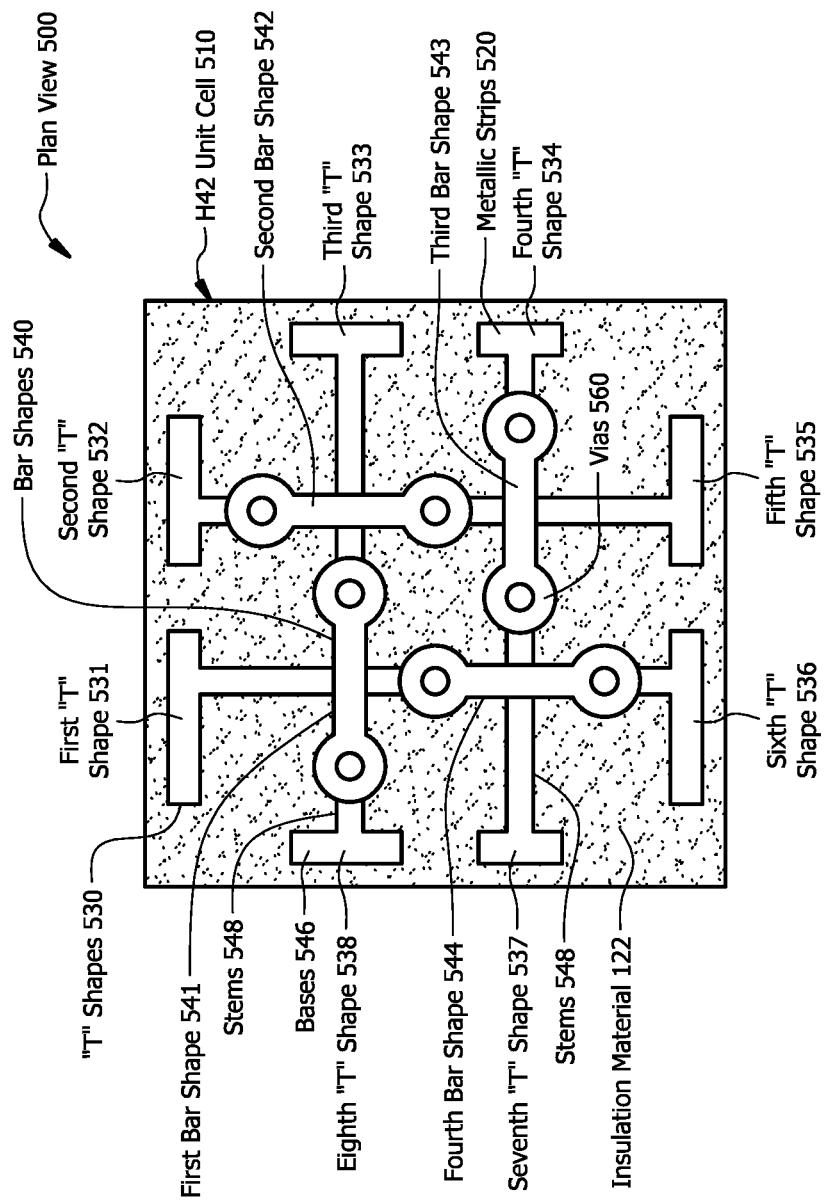
FIG. 5A illustrates a plan view of an H42 unit cell, in accordance with certain embodiments.
Figure 5B:
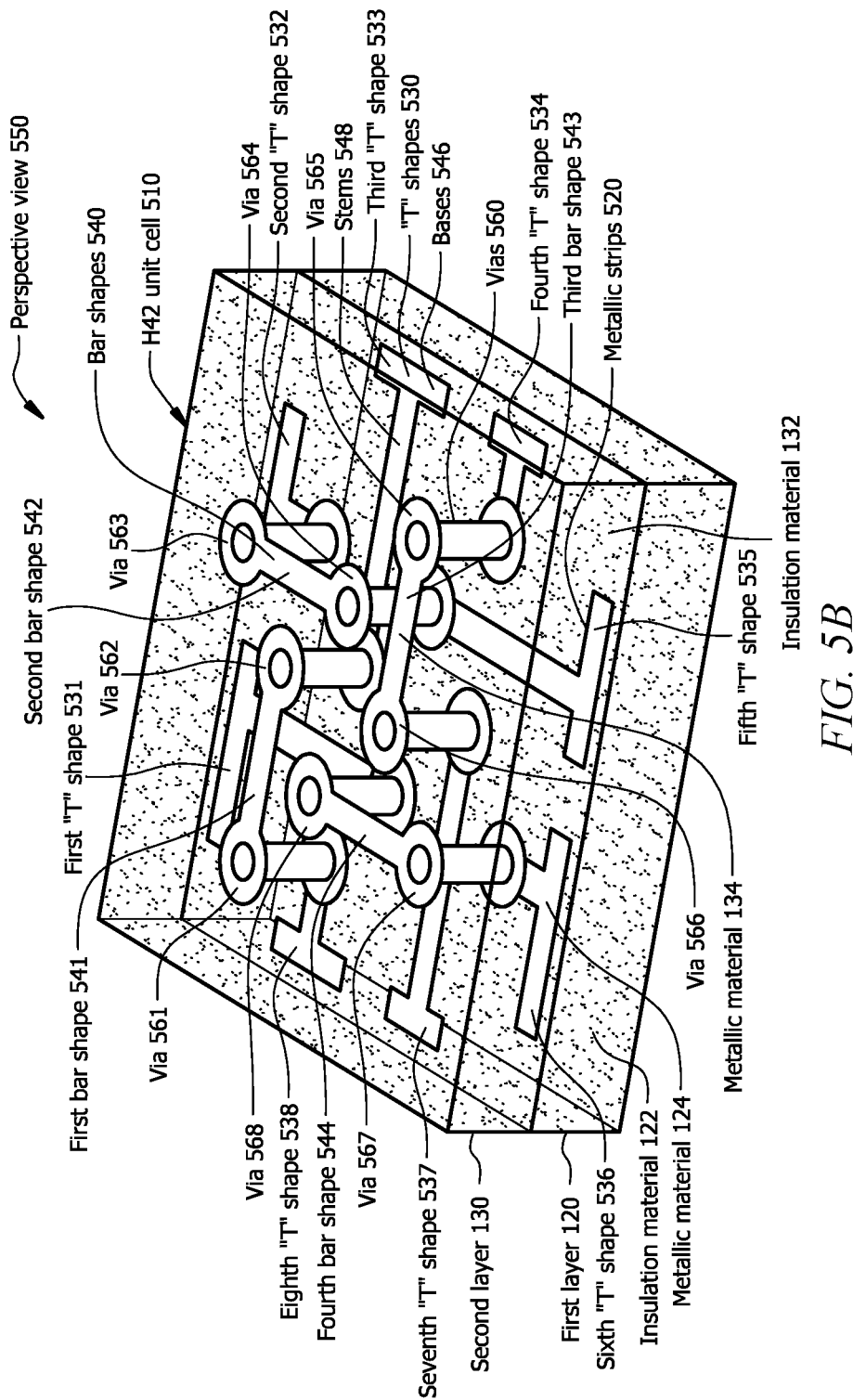
FIG. 5B illustrates a perspective view of the H42 unit cell of FIG. 5A, in accordance with certain embodiments.
Figure 6:
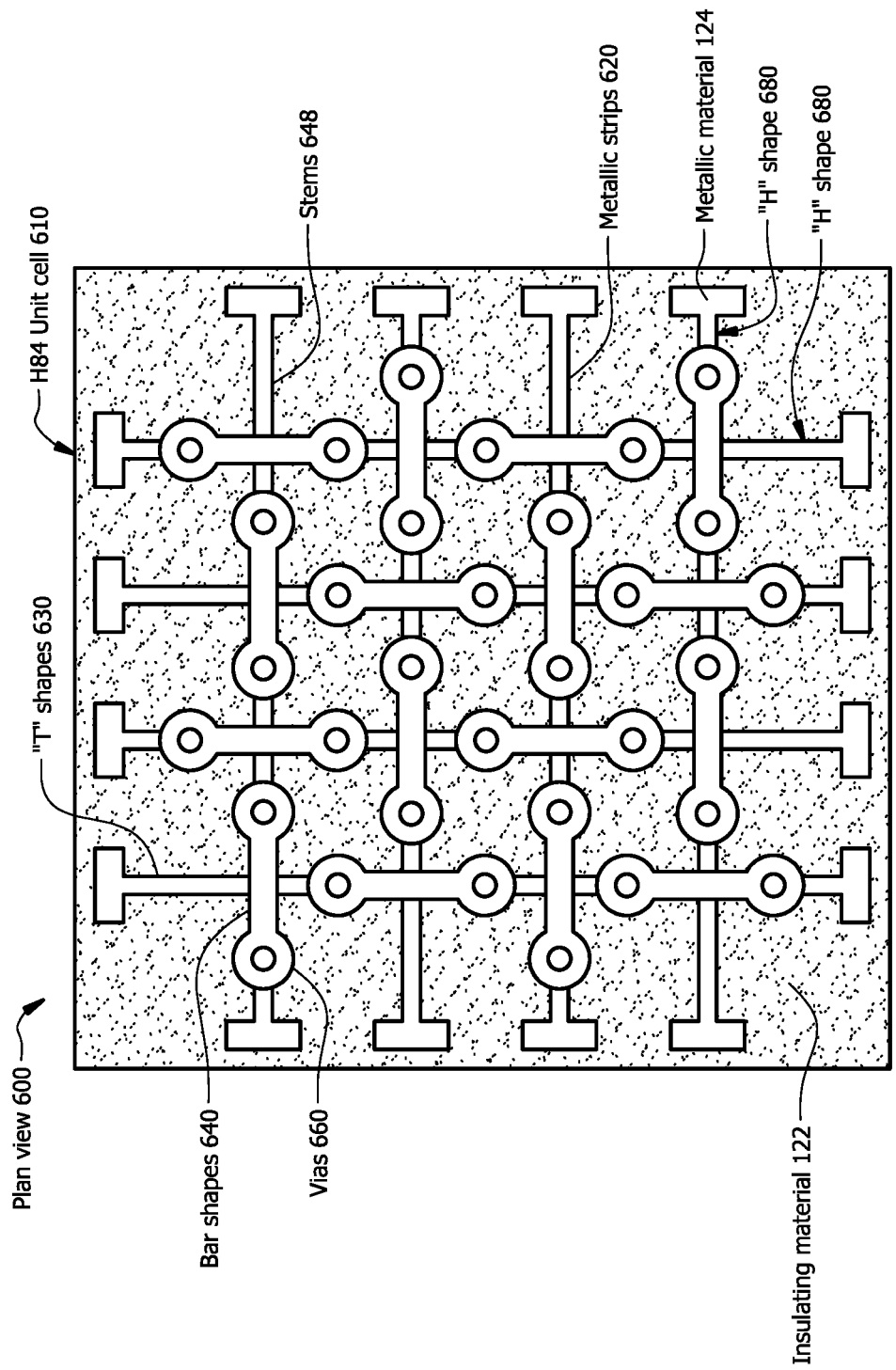
FIG. 6 illustrates a plan view of an H84 unit cell, in accordance with certain embodiments.
Figure 7:
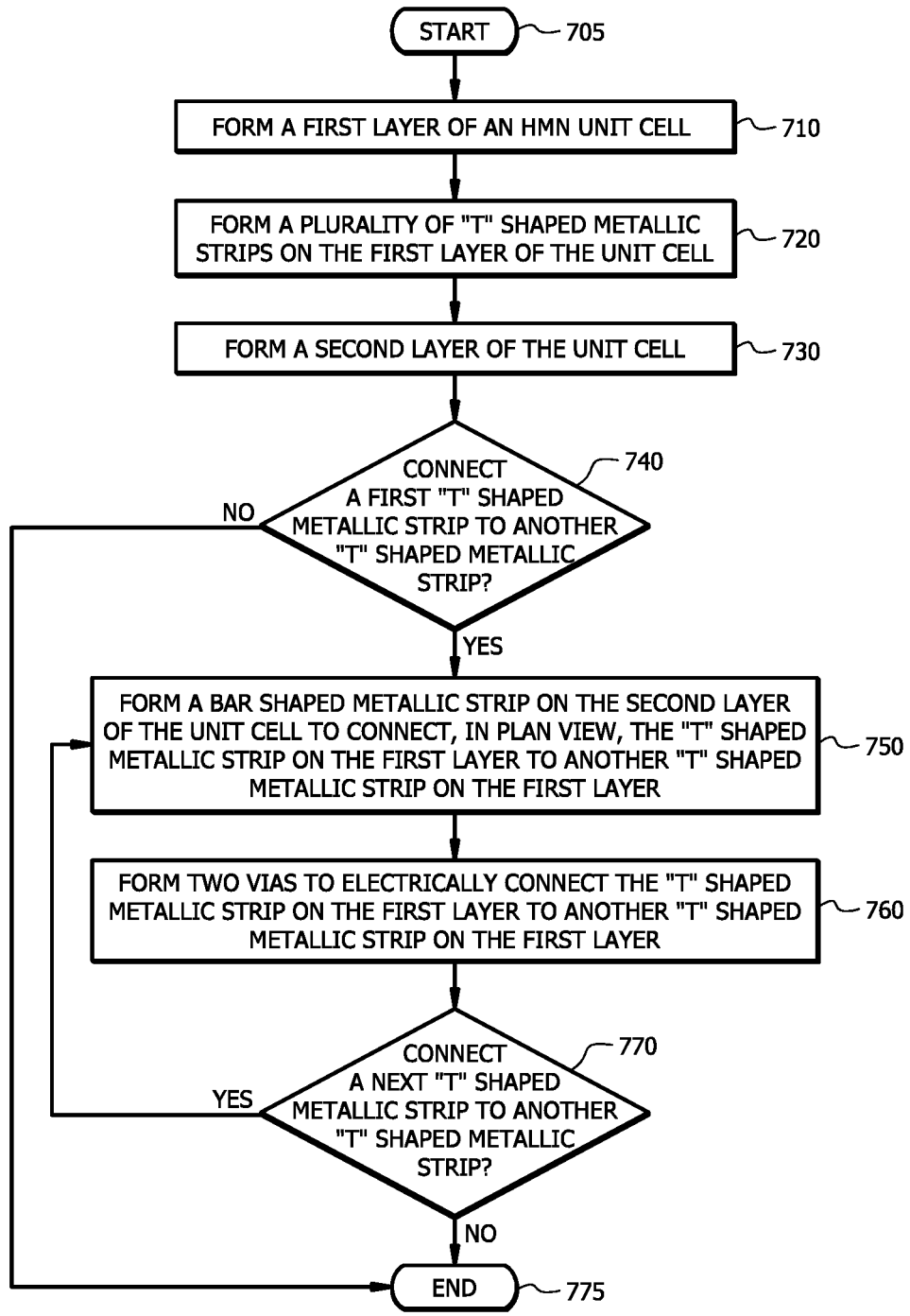
FIG. 7 illustrates a method for manufacturing a unit cell that belongs to the HMN unit cell class, in accordance with certain embodiments.
Figure 8:
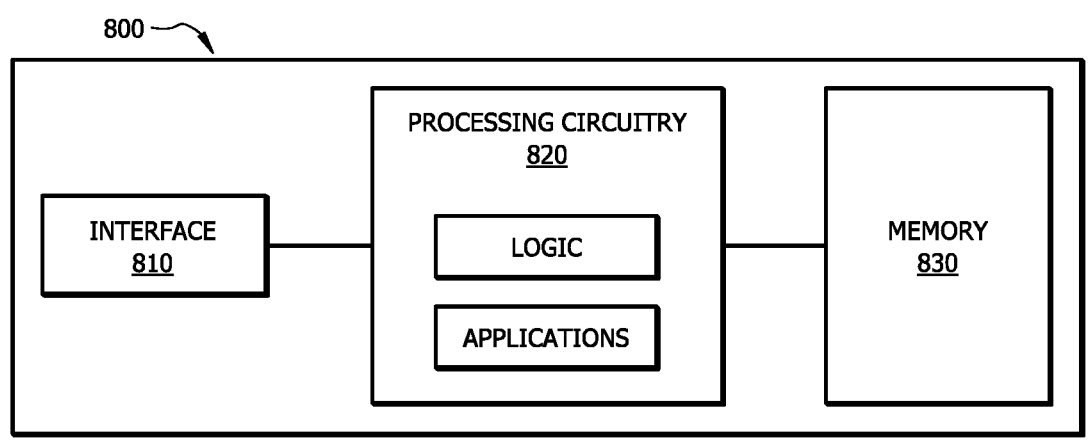
FIG. 8 illustrates an example computer system that may be used by the systems and methods described herein.

FIGS. 1 through 8 show example apparatuses and methods for unit cells as well as the advantages that the HMN unit cell class has over existing unit cells (e.g., the H-cross unit cell and the J-cross unit cell.) FIG. 1 shows an example unit cell. FIG. 2A shows a plan view of an example H-cross unit cell, and FIG. 2B shows a perspective view of the H-cross unit cell of FIG. 2A. FIG. 3A shows a plan view of an example J-cross unit cell, and FIG. 3B shows a perspective view of the J-cross unit cell of FIG. 3A. FIG. 4A shows a plan view of an example dual layer J-cross unit cell, and FIG. 4B shows a perspective view of the dual layer J-cross unit cell of FIG. 4A. FIG. 5A shows a plan view of an example H42 unit cell, and FIG. 5B shows a perspective view of the H42 unit cell of FIG. 5A. FIG. 6 shows a plan view of an H84 unit cell. FIG. 7 shows an example method for manufacturing a unit cell that belongs to the HMN unit cell class. FIG. 8 shows an example computer system that may be used by the systems and methods described herein.

FIG. 1 illustrates an example unit cell 100. Unit cell 100 is a physical structure that is periodically arranged in a pattern. The periodic pattern may form an array of unit cells 100. For example, an i×j array of unit cells 100 may be formed, where i and j each represent any suitable integer.

Unit cells 100 may be used to design antennas in applications such as Wi-Fi routers, sensors, cell phones, and the like.

Unit cell 100 may include one or more components of a printed circuit board (PCB). In certain embodiments, unit cell 100 is less than 50 millimeters in width, less than 50 millimeters in length, and less than 500 micrometers in depth. For example, unit cell 100 may be between 2 and 25 millimeters (e.g., 2.5 millimeters) in width, between 2 and 25 millimeters (e.g., 2.5 millimeters) in length, and between 50 and 250 micrometers (e.g., 100 micrometers) in depth. One or more portions of unit cell 100 may include copper, aluminum, iron, iron, glass, paper, epoxy resin polyester, ceramics, polytetrafluoroethylene (Teflon), Flame Resistant (FR)-1, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), and the like.

Unit cell 100 of FIG. 1 includes a ground layer 110, a first layer 120, and a second layer 130. Ground layer 110 of unit cell 100 is an electrically conductive surface. Ground layer 110 may be a solid material that acts as a ground plane for shielding and power return. In certain embodiments, ground layer 110 is a layer of copper foil on a PCB. First layer 120 of unit cell 100 includes an insulating material 122 and a metallic material 124. Insulating material 122 may be a dielectric composite material. Insulating material 122 may include a matrix (e.g., an epoxy resin) and a reinforcement (e.g., woven or non-woven glass fibers). Insulating material 122 may include any suitable materials, such as glass, paper, epoxy resin, polyester, ceramics (e.g., titanate ceramics), a combination thereof, or any other suitable material with insulating properties. Metallic material 124 of first layer 120 is a metal. Metallic material 124 may include copper, aluminum, iron, a combination thereof, or any other suitable metal. First layer 120 of unit cell 100 is located, in plan view, above and adjacent to ground layer 110.

Second layer 130 of unit cell 100 includes an insulating material 132 and a metallic material 134. Insulating material 132 may be a dielectric composite material. Insulating material 132 may include a matrix (e.g., an epoxy resin) and a reinforcement (e.g., woven or non-woven glass fibers). Insulating material 132 may include any suitable materials, such as glass fibers, paper, epoxy resin, ceramics (e.g., titanate ceramics), a combination thereof, or any other suitable material with insulating properties. Metallic material 134 of first layer 130 is a metal. In certain embodiments, insulating material 132 of second layer 130 is the same as insulating material 122 of first layer 120. In some embodiments, insulating material 132 of second layer 130 is different than insulating material 122 of first layer 120. Metallic material 134 may include copper, aluminum, iron, a combination thereof, or any other suitable metal. In certain embodiments, metallic material 134 of second layer 130 is the same as metallic material 124 of first layer 120. In some embodiments, metallic material 134 of second layer 130 is different than metallic material 124 of first layer 120. Second layer 130 of unit cell 100 is located, in plan view, above and adjacent to first layer 120.

Although unit cell 100 of FIG. 1 illustrates a particular number of ground planes 110, first layers 120, and second layers 130, this disclosure contemplates any suitable number of ground layers 110, first layers 120, and second layers 130. For example, unit cell 100 of FIG. 1 may include more or less than two layers. Although unit cell 100 illustrates a particular arrangement of ground layer 110, first layer 120, and second layer 130, this disclosure contemplates any suitable arrangement of ground layer 110, first layer 120, and second layer 130. For example, first layer 120 may include metallic material 124 on both sides of insulating material 122.

Figure 2A:
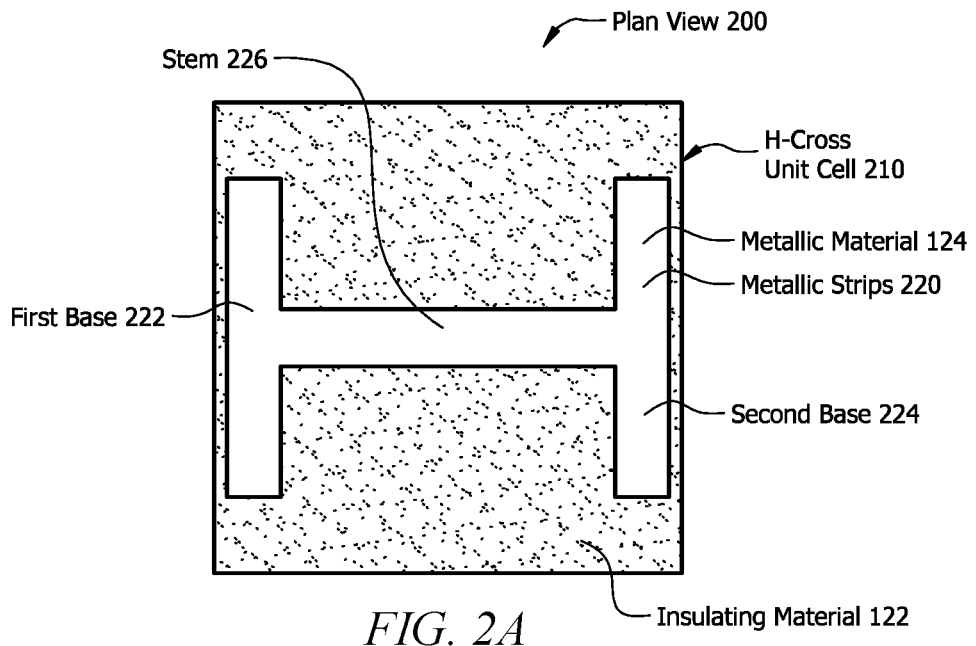
FIG. 2A illustrates a plan view of an H-cross unit cell, in accordance with certain embodiments.

FIG. 2A illustrates a plan view 200 of an H-cross unit cell 210. H-cross unit cell 210 of FIG. 2A includes insulating material 122 and metallic material 124 of FIG. 1. Metallic material 124 of H-cross unit cell 210 forms metallic strips 220. In the illustrated embodiment of FIG. 2A, metallic strips 220 are copper. Metallic strips 220 form an "H" shape that includes a first base 222, a second base 224, and a stem 226. First base 222 is parallel to second base 224. Stem 226 is perpendicular to first base 222 and second base 224. A first end of stem 226 terminates at first base 222, and a second end of stem 226 terminates at base 224. In the illustrated embodiment of FIG. 2A, the length of first base 222 is the same as the length of second base 224.

Figure 2B:
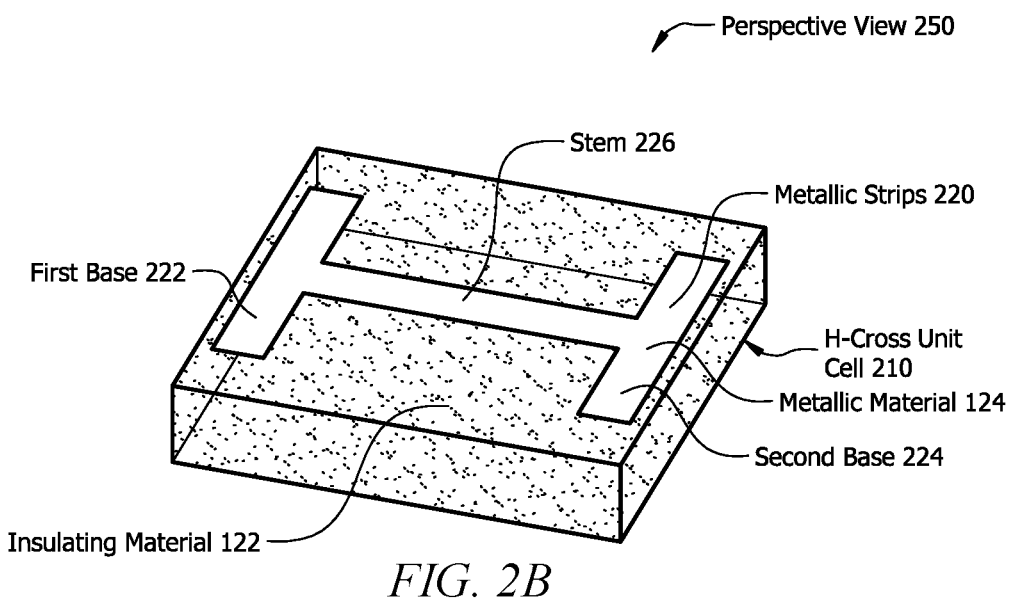
FIG. 2B illustrates a perspective view of the H-cross unit cell of FIG. 2A, in accordance with certain embodiments.

FIG. 2B illustrates a perspective view 250 of H-cross unit cell 210 of FIG. 2A. Perspective view 250 shows insulating material 122 and metallic material 124 of H-cross unit cell 210. Insulating material 122 and metallic material 124 of H-cross unit cell 210 create a layer (e.g., first layer 120 of FIG. 2A). Stem 226 of H-Cross unit cell 210 responds to one direction (e.g., horizontal) of polarization by coupling to light when radiated. First base 222 and second base 224 of H-cross unit cell 210 couple to adjacent H-Cross unit cells 210 to absorb radiation.

Figure 3A:
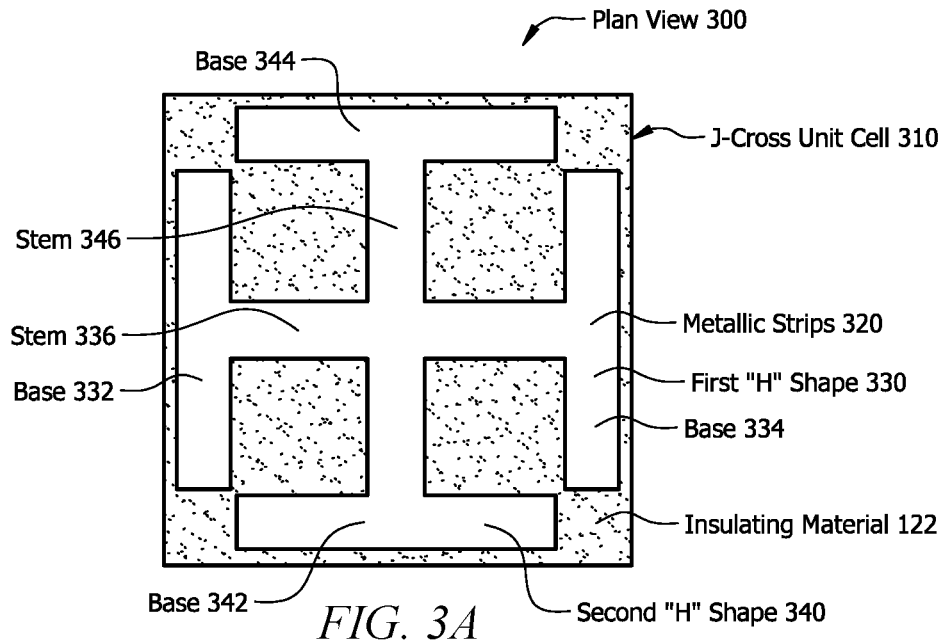
FIG. 3A illustrates a plan view of a J-cross unit cell, in accordance with certain embodiments.

FIG. 3A illustrates a plan view 300 of a J-cross unit cell 310. The unit cell is known as a J-cross unit cell due to its resemblance to the Jerusalem cross, not the letter "J". J-cross unit cell 310 of FIG. 3A includes insulating material 122 and metallic material 124 of FIG. 1. Metallic material 124 of J-cross unit cell 310 forms metallic strips 320. In the illustrated embodiment of FIG. 3A, metallic strips 320 are copper. Metallic strips 320 form a first "H" shape 330 that includes a first base 332, a second base 334, and a stem 336. First base 332 is parallel to second base 334. Stem 336 is perpendicular to first base 332 and second base 334. A first end of stem 336 terminates at first base 332, and a second end of stem 336 terminates at base 334. In the illustrated embodiment of FIG. 3A, the length of first base 332 is the same as the length of second base 334.

Metallic strips 320 of J-cross unit cell 310 form a second "H" shape 340. Second "H" shape 340 is rotated 90 degrees from first "H" shape 330. Second "H" shape 340 of FIG. 3A includes a first base 342, a second base 344, and a stem 346. First base 342 of second "H" shape 340 is parallel to second base 344. Stem 346 of second "H" shape 340 is perpendicular to first base 342 and second base 334. A first end of stem 346 terminates at first base 342, and a second end of stem 346 terminates at base 344. In the illustrated embodiment of FIG. 3A, the length of first base 342 of second "H" shape 340 is the same as the length of second base 344. Stem 346 of second "H" shape 340 intersects stem 336 of first "H" shape 330.

Figure 3B:
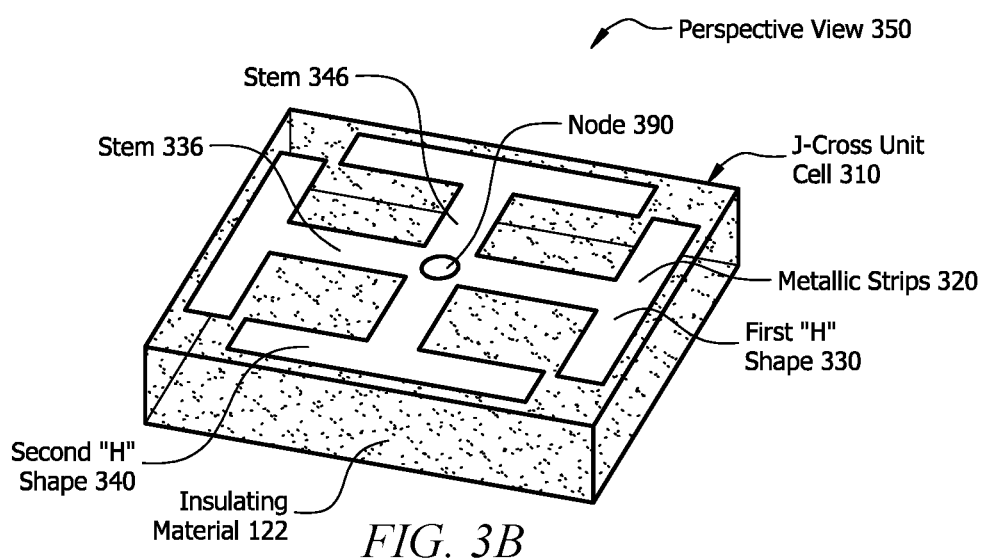
FIG. 3B illustrates a perspective view of the J-cross unit cell of FIG. 3A, in accordance with certain embodiments.

FIG. 3B illustrates a perspective view 350 of J-cross unit cell 310 of FIG. 3A. Perspective view 350 shows insulating material 122 and metallic material 124 of J-cross unit cell 310. Insulating material 122 and metallic material 124 of J-cross unit cell 310 create a layer (e.g., first layer 120 of FIG. 2A). Stem 336 of first "H" shape 330 responds to a first direction (e.g., horizontal) of polarization by coupling to light when radiated, and stem 346 of second "H" shape 340 responds to a second direction (e.g., vertical) of polarization by coupling to light when radiated. However, the connection at the center of base 332 of first "H" shape 330 and the center of base 342 of second "H" shape 340 creates an electric field node 390, which introduces unfavorable polarization coupling between the two "H" shapes.

FIG. 4A illustrates a plan view 400 of a dual layer J-cross unit cell 410. Dual layer J-cross unit cell 410 uses the pattern of J-cross unit cell 310 of FIG. 3A and FIG. 3B on two layers (e.g., first layer 120 and second layer 130 of FIG. 1) with offset tessellation. Dual layer J-cross unit cell 410 of FIG. 4A includes insulating material 122 and metallic material 124 of FIG. 1. Metallic material 124 of J-cross unit cell 410 forms metallic strips 420. In the illustrated embodiment of FIG. 4A, metallic strips 420 are copper. Metallic strips 420 form a first J-cross 430 and a second J-cross 440. First J-cross 430 is on a first layer (e.g., first layer 120 of FIG. 1) and second J-cross 440 is on a second layer (e.g., second layer 120 of FIG. 1). In the illustrated embodiment of FIG. 4A, second J-cross 440 overlaps first J-cross 430 in plan view.

FIG. 4B illustrates a perspective view 450 of dual layer J-cross unit cell 410 of FIG. 4A. Perspective view 450 shows insulating material 122 and metallic material 124 of first layer 120 of dual layer J-cross unit cell 410. Perspective view 450 also shows insulating material 132 and metallic material 134 of second layer 130 of dual layer J-cross unit cell 410. Second layer 130 of FIG. 4B is stacked on first layer 120. Second J-cross 440 is stacked on first J-cross 430 to cover two frequency bands. However, dual frequency operation may be frustrated by second J-cross 440 shadowing first J-cross 430 from illuminating radiation. Dual frequency operation may also be frustrated by first bases 432 of first J-cross 430 being on first layer 120 and second bases 442 of second J-cross 440 being on second layer 130. Since the capacitive arms (e.g., first bases 432 and second bases 442) at the extrema of the J-crosses 430 and 440 are on different layers and thus are at different distances from the ground layer, the coupling to the ground layer (e.g., ground layer 110 of FIG. 1) is modified, which introduces cross coupling. In certain instances, broadband operation may require more than two J-cross layers, which may further compound unwanted coupling and shadowing frustrations.

FIG. 5A illustrates a plan view 500 of an H42 unit cell 510. H42 unit cell 510 is a canonical example of the HMN unit cell class, where M=4 and N=2. H42 unit cell 510 includes 4 "H" shapes with 2 "H" shapes in a first direction, thus the name H42. Two "H" shapes are in a first direction (e.g., a horizontal direction) such that a stem of each of the two "H" shapes extends in the first direction. The remaining two "H" shapes are in a second direction (e.g., a vertical direction) such that a stem of each of the two remaining two "H" shapes extends in the second direction. The first direction is perpendicular to the second direction.

H42 unit cell 510 includes insulating material 122 and metallic material 124 of FIG. 1. Metallic material 124 of H42 unit cell 510 forms metallic strips 520. In the illustrated embodiment of FIG. 5A, metallic strips 520 are copper. Metallic strips 520 form a plurality of "T" shapes 530. The plurality of "T" shapes 530 include a first "T" shape 531, a second "T" shape 532, a third "T" shape 533, a fourth "T" shape 534, a fifth "T" shape 535, a sixth "T" shape 536, a seventh "T" shape 537, and an eighth "T" shape 538. First "T" shape 531, second "T" shape 532, third "T" shape 533, fourth "T" shape 534, fifth "T" shape 535, sixth "T" shape 536, seventh "T" shape 537, and eighth "T" shape 538 are located on a first layer (e.g., first layer 120 of FIG. 1.)

Each "T" shape 530 includes a base 546 and a stem 548. Each stem 548 of each "T" shape 530 is perpendicular to its corresponding base 546. Each stem 548 may intersect its corresponding base 546 at any location along the length of base 546. In certain embodiments, stem 548 intersects its corresponding base 546 at a midpoint of base 546. Two or more bases 546 and/or stems 548 may be the same or different in length. For example, each base 546 of each "T" shape 530 may have a different length. As another example, stems 548 of first "T" shape 531, third "T" shape 533, fifth "T" shape 535, and seventh "T" shape 537 may have a first length L1. As still another example, stems 548 of second "T" shape 532, fourth "T" shape 534, sixth "T" shape 536, and eighth "T" shape 538 may have a second length L2 that is different than first length L1. In certain embodiments, length L2 is shorter than length L1.

Metallic strips 520 of H42 unit cell 510 form a plurality of bar shapes 540. Bar shapes 540 are electrically connected to "T" shapes 530 with vias 560. Bar shapes 540 include a first bar shape 541, a second bar shape 542, a third bar shape 543, and a fourth bar shape 544. First bar shape 541, second bar shape 542, third bar shape 543, and fourth bar shape 544 are located on a second layer (e.g., second layer 130 of FIG. 1). First bar shape 541 connects, in plan view, an end of stem 548 of third "T" shape 533 to an end of stem 548 of eighth "T" shape 538. Second bar shape 542 connects, in plan view, an end of stem 548 of second "T" shape 532 to an end of stem 548 of fifth "T" shape 535. Third bar shape 543 connects, in plan view, an end of stem 548 of fourth "T" shape 534 to an end of stem 548 of seventh "T" shape 537. Fourth bar shape 544 connects, in plan view, an end of stem 548 of first "T" shape 531 to an end of stem 548 of sixth "T" shape 536.

The plurality of "T" shapes 530 of the first layer and the plurality of bar shapes 540 of the second layer of H42 unit cell 510 form four "H" shapes in plan view. The stems of the first two "H" shapes are in a first direction and the stems of the second two "H" shapes are in a second direction perpendicular to the first direction. The first "H" shape is formed by first "T" shape 531, fourth bar shape 544, and sixth "T" shape 536. The second "H" shape is formed by second "T" shape 532, second bar shape 542, and fifth "T" shape 535. The third "H" shape is formed by third "T" shape 533, first bar shape 541, and eighth "T" shape 538. The fourth "H" shape is formed by fourth "T" shape 534, third bar shape 543, and seventh "T" shape 537. Each of the four "H" shapes is electrically isolated from the other three "H" shapes, as described in FIG. 5B below.

FIG. 5B shows a perspective view 550 of H42 unit cell 510 of FIG. 5A. Perspective view 550 shows insulating material 122 and metallic material 124 of first layer 120 and insulating material 132 and metallic material 134 of second layer 130 of H42 unit cell 510. Second layer 130 of H42 unit cell 510 is stacked on first layer 120. Metallic strips 520 are electrically connected to metallic strips 520 on second layer 130 with vias 560. Each via 560 is an electrical connection between metallic material 124 of first layer 120 and metallic material 134 of second layer 130 of H42 unit cell 510. Each via 560 passes through insulating material 132 of second layer 130. Each via 560 may include a first pad in first layer 120 and a second pad in second layer 130 that are electrically connected by a hole through insulating material 132 of second layer 130. The hole through second layer 130 may be lined with a conductive tube or a rivet. The hole may be made conductive by electroplating.

As illustrated in perspective view 550 of FIG. 5B, "T" shapes 530 are electrically connected to bar shapes 540 with vias 560. Vias 660 include first via 561, second via 562, third via 563, fourth via 564, fifth via 565, sixth via 566, seventh via 567, and eighth via 568. A first end of first bar shape 541 is electrically connected by first via 561 to an end of stem 548 of eighth "T" shape 538. A second end of first bar shape 541 is electrically connected by second via 562 to an end of stem 548 of third "T" shape 533. A first end of second bar shape 542 is electrically connected by third via 563 to an end of stem 548 of second "T" shape 532. A second end of bar shape 542 is electrically connected by fourth via 564 to an end of stem 548 of fifth "T" shape 535. A first end of third bar shape 543 is electrically connected by fifth via 565 to an end of stem 548 of fourth "T" shape 534. A second end of third bar shape 543 is electrically connected by sixth via 566 to an end of stem 548 of seventh "T" shape 537. A first end of fourth bar shape 544 is electrically connected by seventh via 567 to an end of stem 548 of sixth "T" shape 536. A second end of fourth bar shape 544 is electrically connected by second via 568 to an end of stem 548 of first "T" shape 531.

Vias 520 of H42 unit cell 510 allow bar shapes 540 of second layer 130 to connect stems 548 of opposite "T" shapes 530 of first layer 120. As such, the four "H" shapes described in FIG. 5A above are electrically isolated from each other, which avoids polarization coupling and voltage pinning. First layer 120 of H42 unit cell 510 is utilized for capacitive coupling and radiative coupling. Second layer 130 of H42 unit cell 510 is utilized for routing to alleviate coupling between the four "H" shapes. Each base 546 of each "T" shape 530 does not overlap any other base 546, which reduces capacitive vertical coupling. All bases 546, which act as capacitors, are the same distance from the ground layer (e.g., ground layer 110 of FIG. 1.) Second layer 130 does not include any bases 546, which reduces shadowing of illumination.

Each of the four "H" shapes includes a bar shape 540 that shadows another "H" shape and is itself shadowed by a perpendicular bar shape 540. For electrical isolation to be achieved, some shadowing may occur. The illustrated embodiment of FIG. 5B provides for symmetric shadowing between all "H" shapes. H42 unit cell 510 is well suited to readily available low-cost light-weight thin-board manufacturing. As such, H42 unit cell 510 provides simultaneous broad frequency coverage, dual polarization coverage, and multiple angle-of-incidence coverage.

Although H42 unit cell 510 of FIGS. 5A and 5B illustrates a particular arrangement of first layer 120, second layer 130, metallic strips 520, and vias 560, this disclosure contemplates any suitable arrangement of first layer 120, second layer 130, metallic strips 520, and vias 560. For example, a unit cell belonging to the HMN unit cell class may include a third layer and a fourth layer. As another example, a plurality of H42 unit cells 510 may be arranged within a PCB. As still another example, bar shapes 540 may be placed on first layer 120 and "T" shapes 530 may be placed on second layer 130.

Although H42 unit cell 510 of FIGS. 5A and 5B illustrates a particular number of first layers 120, second layers 130, metallic strips 520, and vias 560, this disclosure contemplates any suitable number of first layers 120, second layers 130, metallic strips 520, and vias 560. In certain embodiments, metallic strips 520 of a unit cell belonging to the HMN unit cell class may include "N" amount of "H" shapes in a first direction and "M-N" amount of "H" shapes in a second direction, where "M" and "N" each represent any suitable integer. For example, a unit cell belonging to the HMN unit cell class may include a unit cell with 2 "H"

shapes in a first direction and 1 "H" shape in a second direction. Such a unit cell would be known as an H31 unit cell. The illustrated embodiment of FIG. 6 below shows a configuration of an H84 unit cell belonging to the HMN unit cell class that uses four "H" shapes in a first direction and four "H" shapes in a second direction.

FIG. 6 shows an example plan view 600 of another unit cell belonging to the HMN unit cell class. The unit cell of FIG. 6 is an H84 unit cell 610 that includes eight "H" shapes 680 total. Four "H" shapes 680 are in a first direction (e.g., a horizontal direction) such that a stem of each of the four "H" shapes 680 extends in the first direction. The remaining four "H" shapes 680 are in a second direction (e.g., a vertical direction) such that a stem of each of the four remaining eight "H" shapes 680 extends in the second direction. The first direction is perpendicular to the second direction.

H84 unit cell 610 includes insulating material 122 and metallic material 124 of FIG. 1. Metallic material 124 of H84 unit cell 610 forms metallic strips 620. In the illustrated embodiment of FIG. 5A, metallic strips 620 are copper. Metallic strips 620 form a plurality of "T" shapes 630. The plurality of "T" shapes 630 are located on a first layer (e.g., first layer 120 of FIG. 1.) Each "T" shape 630 includes a base 646 and a stem 648. Each stem 648 of each "T" shape 630 is perpendicular to its corresponding base 646. Each stem 548 may intersect its corresponding base 646 at any location along the length of base 646. In certain embodiments, stem 648 intersects its corresponding base 646 at a midpoint of base 646. Two or more bases 646 and/or stems 648 may be the same or different in length. For example, each base 646 may have a different length.

Metallic strips 620 of H84 unit cell 610 form a plurality of bar shapes 640. Bar shapes 640 are located on a second layer (e.g., second layer 130 of FIG. 1). Bar shapes 640 of the second layer are used to connect, in plan view, each stem 648 of each "T" shape 630 of the first layer to another stem 648 of another "T" shape 630 of the first layer. Vias 660 are used to electrically connect an end of each bar shape 630 of the second layer to an end of each stem 648 of each "T" shape 630 of the first layer.

The plurality of "T" shapes 630 of the first layer and the plurality of bar shapes 640 of the second layer of H84 unit cell 610 form eight "H" shapes 680 in plan view. Each of the eight "H" shapes is electrically isolated from the other "H" shapes, which avoids polarization coupling and voltage pinning. The plurality of "T" shapes 630 of H84 unit cell 610, which are located on the first layer, are utilized for capacitive coupling and radiative coupling. The plurality of bar shapes 640, which are located on the second layer, are utilized for routing to alleviate coupling between the eight "H" shapes. Each base 646 of each "T" shape 630 does not overlap any other base 646, which reduces capacitive vertical coupling. All bases 646, which act as capacitors, are the same distance from the ground layer (e.g., ground layer 110 of FIG. 1.) All bases 646 are on the same layer, which reduces shadowing of illumination. As such, H84 unit cell 610 provides simultaneous broad frequency coverage, dual polarization coverage, and multiple angle-of-incidence coverage.

Although H84 unit cell 610 of FIG. 6 illustrates a particular arrangement of metallic strips 620 and vias 660, this disclosure contemplates any suitable arrangement of metallic strips 620 and vias 660. For example, H84 unit cell 610 of FIG. 6 may include a third layer and a fourth layer. As another example, a plurality of H84 unit cells 610 may be arranged within a PCB.

FIG. 7 shows an example method for manufacturing a unit cell (e.g., H42 unit cell 510 of FIGS. 5A and 5B) that belongs to the HMN unit cell class. Method 700 begins at step 705. At step 710, a first layer (e.g., first layer 120 of unit cell 100 of FIG. 1) of a unit cell belonging to the HMN unit cell class (e.g., H42 unit cell 510 of FIG. 5A) is formed. The first layer is an insulating material. For example, the first layer may be a circuit board substrate made of a dielectric composite material. Method 700 then moves from step 710 to step 720, where a plurality of "T" shaped metallic strips (e.g., "T" shapes 530 of FIG. 5A) are formed on the first layer of the unit cell. Each "T" shape may have a base and a stem. Each base of each "T" shape may act as a capacitor to absorb radiation. The bases are oriented in two directions (e.g., a horizontal and vertical direction) to couple to radiation at two polarizations. Method 700 then moves from step 720 to step 730.

At step 730, a second layer (e.g., second layer 130 of unit cell 100 of FIG. 1) of the unit cell is formed. The second layer is an insulating material. For example, the second layer may be a circuit board substrate made of a dielectric composite material. In certain embodiments, the insulating material of the second layer are the same as the insulating materials of the first layer. Method 700 then moves from step 730 to step 740, where method 700 determines whether to connect a first "T" shaped metallic strip to another "T" shaped metallic strip. For example, method 700 may determine whether to connect an end of a stem of the first "T" shape to an end of the stem of another "T" shape. The stems of the connected "T" shapes form a conductor that couples to light when radiated. If method 700 determines not to connect a first "T" shaped metallic strip to another "T" shaped metallic strip, method 700 moves from step 740 to step 775, where method 700 ends.

If method 700 determines to connect a first "T" shaped metallic strip to another "T" shaped metallic strip, method 700 moves from step 740 to step 750. At step 750, a bar shaped metallic strip (e.g., first bar shape 541 of FIG. 5A) is formed on the second layer of the unit cell to connect, in plan view, the "T" shaped metallic strip (e.g., third "T" shape 533 of FIG. 5A) on the first layer to the other "T" shaped metallic strip (e.g., eighth "T" shape 538 of FIG. 5A) on the first layer. Method 700 then moves from step 750 to step 760.

At step 760, two vias (e.g., vias 560 of FIG. 5B) are formed to electrically connect the "T" Shaped metallic strip on the first layer to the other "T" shaped metallic strip on the first layer. The first via (e.g., via 562 of FIG. 5B) electrically connects a first end of the bar shaped metallic strip on the second layer to an end of the stem of the first "T" shaped metallic strip on the first layer, and the second via (e.g., via 561 of FIG. 5B) electrically connects a second end of the bar shaped metallic strip on the second layer to an end of the stem of the other "T" shaped metallic strip on the first layer. Method 700 then moves from step 760 to step 770.

At step 770, method 700 determines whether to connect a next "T" shaped metallic strip to another "T" shaped metallic strip. If method 700 determines not to connect a next "T" shaped metallic strip to another "T" shaped metallic strip, method 700 moves from step 770 to step 775, where method 700 ends. If method 700 determines to connect a next "T" shaped metallic strip to another "T" shaped metallic strip, method 700 moves from step 770 back to step 750. At step 750, a second bar shaped metallic strip (e.g., second bar shape 542 of FIG. 5A) is formed on the second layer of the unit cell to connect, in plan view, the "T" shaped metallic strip (e.g., second "T" shape 532 of FIG. 5A) on the first layer to the other "T" shaped metallic strip (e.g., fifth "T" shape 535 of FIG. 5A) on the first layer.

Method 700 then moves from step 750 to step 760, where two vias are formed to electrically connect the "T" Shaped metallic strip on the first layer to the other "T" shaped metallic strip on the first layer. The first via (e.g., via 563 of FIG. 5B) electrically connects a first end of the second bar shaped metallic strip on the second layer to an end of the stem of the first "T" shaped metallic strip on the first layer, and the second via (e.g., via 564 of FIG. 5B) electrically connects a second end of the second bar shaped metallic strip on the second layer to an end of the stem of the other "T" shaped metallic strip on the first layer. This process is repeated until all of the conductors are formed. For the H42 unit cell configuration shown in FIG. 5A, this process is repeated four times for each bar shape 540. For the H84 unit cell configuration shown in FIG. 6, this process is repeated 16 times for each bar shape 640. Method 700 then moves to step 775, where method 700 ends.

Manufacturing the unit cell may utilize a computer aided design. For example, data used to fabricate the unit cell may be generated by computer aided design. The "T" shaped metallic strips may be formed by a printing or etching process. For example, the metallic strips may be formed by etching a layer of copper foil into shapes (e.g., a "T" shape or a bar shape.) Etching removes the unwanted metal. One or more components of the unit cell may be formed using one or more chemicals, lasers, milling machines, and the like.

Modifications, additions, or omissions may be made to method 700 depicted in FIG. 7. Method 700 may include more, fewer, or other steps. For example, method 700 may include forming a ground layer (e.g., ground layer 110 of FIG. 1) for the unit cell. Steps of method 700 depicted in FIG. 7 may be performed in parallel or in any suitable order. While discussed as specific components completing the steps of method 800, any suitable component may perform any step of method 700.

FIG. 8 illustrates an example of elements 800 that may be included in and/or used by the unit cells disclosed herein, according to certain embodiments. For example, H42 unit cell 510 of FIGS. 5A and 5B may integrate one or more interface(s) 810, processing circuitry 820, memory(ies) 830, and/or other suitable element(s). As another example, H42 unit cell 510 may be used by a sensor (e.g., a car backup sensor) that includes one or more interface(s) 810, processing circuitry 820, memory(ies) 830, and/or other suitable element(s). Interface 810 receives input, sends output, processes the input and/or output, and/or performs other suitable operation. Interface 810 may comprise hardware and/or software.

Processing circuitry 820 performs or manages the operations of the component. Processing circuitry 820 may include hardware and/or software. Examples of a processing circuitry include one or more computers, one or more microprocessors, one or more applications, etc. In certain embodiments, processing circuitry 820 executes logic (e.g., instructions) to perform actions (e.g., operations), such as generating output from input. The logic executed by processing circuitry 820 may be encoded in one or more tangible, non-transitory computer readable media (such as memory 830). For example, the logic may comprise a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

Memory 830 (or memory unit) stores information. Memory 830 may comprise one or more non-transitory, tangible, computer-readable, and/or computer-executable storage media. Examples of memory 830 include computer memory (for example, RAM or ROM), mass storage media (for example, a hard disk), removable storage media (for example, a Compact Disk (CD) or a Digital Video Disk (DVD)), database and/or network storage (for example, a server), and/or other computer-readable medium.

Herein, a computer-readable non-transitory storage medium or media may include one or more semiconductor-based or other integrated circuits (ICs) (such field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A system, comprising:
    a ground layer;
    a first layer comprising a first insulating material and a plurality of first metallic strips, wherein the first layer is stacked on the ground layer;

a second layer comprising a second insulating material and a plurality of second metallic strips, wherein the second layer is stacked on the first layer; and a plurality of vias configured to electrically connect one or more of the plurality of first metallic strips of the first layer to one or more of the plurality of second metallic strips of the second layer;

wherein:

the plurality of first metallic strips of the first layer and the plurality of second metallic strips of the second layer form a plurality of capacitors and a plurality of conductors;

each capacitor of the plurality of capacitors is located in the first layer; and each conductor of the plurality of conductors is partially located in the first layer and partially located in the second layer.

2. The system of claim 1, wherein:

the plurality of first metallic strips of the first layer and the plurality of second metallic strips of the second layer form, in plan view, four "H" shapes;

two of the four "H" shapes have a first orientation and two of the four "H" shapes have a second direction;

the two "H" shapes having the first orientation intersect, in plan view, the two "H" shapes having the second direction; and each "H" shape of the four "H" shapes is electrically isolated from the other three "H" shapes.

3. The system of claim 1, wherein:

the plurality of first metallic strips of the first layer form eight "T" shapes, each "T" shape having a base and a stem;

the first end of each stem of each "T" shape is attached to the base of the corresponding "T" shape; and the second end of each stem of each "T" shape is attached to a via of the plurality of vias.

4. The system of claim 1, wherein:

the plurality of second metallic strips of the second layer form four separate bar shapes; and each end of each bar shape is connected to a via of the plurality of vias.

5. The system of claim 1, wherein:

the first layer and second layer are each a printed circuit board;

the first insulating material of the first layer and the second insulating material of the second layer each comprise a glass fiber and epoxy composite; and the plurality of first metallic strips of the first layer and the plurality of second metallic strips of the second layer each comprise copper.

6. The system of claim 1, wherein:

the plurality of first metallic strips of the first layer and the plurality of second metallic strips of the second layer form, in plan view, four "H" shapes;

each "H" shape has a first base, a second base, and a stem connecting the first base to the second base; and each first base and each second base of each "H" shape is in the first layer.

7. A unit cell, comprising:

a first layer comprising a first insulating material and a plurality of first metallic strips;

a second layer comprising a second insulating material and a plurality of second metallic strips; and a plurality of vias configured to electrically connect one or more of the plurality of first metallic strips of the first layer to one or more of the plurality of second metallic strips of the second layer;

wherein:

the plurality of first metallic strips of the first layer and the plurality of second metallic strips of the second layer form, in plan view, four "H" shapes;

two of the four "H" shapes have a first orientation and two of the four "H" shapes have a second direction;

the two "H" shapes having the first orientation intersect, in plan view, the two "H" shapes having the second direction; and each "H" shape of the four "H" shapes is electrically isolated from the other three "H" shapes.

8. A unit cell, comprising:

a first layer comprising a first insulating material and a plurality of first metallic strips;

a second layer comprising a second insulating material and a plurality of second metallic strips; and a plurality of vias configured to electrically connect one or more of the plurality of first metallic strips of the first layer to one or more of the plurality of second metallic strips of the second layer;

wherein:

the plurality of first metallic strips of the first layer form eight "T" shapes, each "T" shape having a base and a stem;

the first end of each stem of each "T" shape is attached to the base of the corresponding "T" shape; and the second end of each stem of each "T" shape is attached to a via of the plurality of vias.

9. The unit cell of claim 7, wherein:

the plurality of second metallic strips of the second layer form four separate bar shapes; and each end of each bar shape is connected to a via of the plurality of vias.

10. The unit cell of claim 7, wherein:

the first layer and second layer are each a printed circuit board;

the first insulating material of the first layer and the second insulating material of the second layer each comprise a glass fiber and epoxy composite; and the plurality of first metallic strips of the first layer and the plurality of second metallic strips of the second layer each comprise copper.

11. The unit cell of claim 7, wherein:

each "H" shape has a first base, a second base, and a stem connecting the first base to the second base; and each first base and each second base of each "H" shape is in the first layer.

12. The unit cell of claim 8, wherein:

each base of each "T" shape is a different length;

the plurality of second metallic strips of the second layer form four separate bar shapes; and each bar of the plurality of second metallic strips of the second layer is the same length.

* * * * *